(12) United States Patent
Ye

(10) Patent No.: US 11,031,775 B2
(45) Date of Patent: Jun. 8, 2021

(54) DC ELECTRONIC SWITCH WITH TEMPERATURE INDEPENDENT CURRENT LIMIT

(71) Applicant: Enlighten Luminaires, Paramus, NJ (US)

(72) Inventor: Yang Ye, Toronto (CA)

(73) Assignee: ENLIGHTEN LUMINAIRES LLC, Paramus, NJ (US)

( * ) Notice: Subject to any disclaimer, the term of this patent is extended or adjusted under 35 U.S.C. 154(b) by 244 days.

(21) Appl. No.: 16/272,107

(22) Filed: Feb. 11, 2019

(65) Prior Publication Data

US 2020/0259407 A1 Aug. 13, 2020

(51) Int. Cl.

| | |
|---|---|
| *H02H 9/02* | (2006.01) |
| *H02M 1/32* | (2007.01) |
| *H02M 1/36* | (2007.01) |
| *H02M 3/335* | (2006.01) |
| *H03K 7/08* | (2006.01) |
| *H03K 17/14* | (2006.01) |
| *H03K 17/082* | (2006.01) |
| *H02M 1/00* | (2006.01) |
| *H02H 1/00* | (2006.01) |
| *G01R 19/32* | (2006.01) |
| *H02H 9/00* | (2006.01) |

(52) U.S. Cl.
CPC .............. *H02H 9/025* (2013.01); *H02H 9/02* (2013.01); *H02M 1/32* (2013.01); *H02M 1/36* (2013.01); *H02M 3/33576* (2013.01); *H03K 7/08* (2013.01); *H03K 17/0822* (2013.01); *H03K 17/145* (2013.01); *G01R 19/32* (2013.01); *H02H 1/0007* (2013.01); *H02H 9/001* (2013.01); *H02M 2001/0009* (2013.01)

(58) Field of Classification Search
CPC ........ H02H 1/0007; H02H 9/001; H02H 9/02; H02H 9/025; G01R 19/32
See application file for complete search history.

(56) References Cited

U.S. PATENT DOCUMENTS

| | | |
|---|---|---|
| 7,408,755 B1 | 8/2008 | Ye et al. |
| 2006/0050541 A1* | 3/2006 | Terdan .................... H02H 9/001 363/70 |
| 2009/0103222 A1* | 4/2009 | Hinterscher ........... H02H 9/025 361/93.9 |

(Continued)

*Primary Examiner* — Fred E Finch, III
*Assistant Examiner* — Rafael O De Leon Domenech
(74) *Attorney, Agent, or Firm* — Michael J. Feigin, Esq.; Feigin and Fridman LLC

(57) ABSTRACT

A negative feedback closed loop circuit composed of an operational amplifier, a main switch, and a current sense resistor is applied to limit the current to a pre-defined threshold whenever there is an overload or short circuit condition is the circuit. A timing circuit composed of resistors and a capacitor is used to provide timing of turning off the circuit. The timing circuit is always charged from the same voltage and started from the same moment of main switching entering into current limit mode. The voltage reference is set by a voltage divider. The timing capacitor voltage and the voltage reference is compared in a comparator. Since both the amplifier circuit and the comparator circuit are temperature independent, the current limiting point and the time delay to turn off the switch are also both independent of temperature.

14 Claims, 2 Drawing Sheets

(56) References Cited

U.S. PATENT DOCUMENTS

2011/0156688 A1* 6/2011 Lin .................. H02M 1/32
  323/284
2015/0130438 A1* 5/2015 Kang ................ G05F 1/573
  323/282

* cited by examiner

US 11,031,775 B2

DC ELECTRONIC SWITCH WITH TEMPERATURE INDEPENDENT CURRENT LIMIT

FIELD OF THE DISCLOSED TECHNOLOGY

The present invention relates to DC voltage power supplies and more particularly to inrush/transient current limiting and overload/short circuit protection for DC voltage power supplies.

BACKGROUND OF THE DISCLOSED TECHNOLOGY

Devices which utilize DC (direct current) voltage can encounter power surges and other conditions that can damage electrical system components. Such conditions which can cause damage to devices include inrush currents, transient currents, circuit overloads and short circuits. Inrush currents are defined as a momentary high current that occurs when the power supply is first turned on. Transient current increases are defined as brief changes in the input voltage. Circuit overloads are defined as malfunctions in output load voltage or current. Short circuits are defined as feeder lines being shorted (directly connected).

Providing protection against damage is a difficult challenge in DC voltage power supply designs. U.S. Pat. No. 7,408,755 to Ye et al provides an inrush current limiting circuitry with a time delay to prevent short circuits. This includes a current limiting circuit, temperature compensation circuit, and circuitry to turn off the electrical output after a capacitor has been charged. This allows for a certain amount of time to pass during which there is an abnormal power condition before the circuit it shut off. However, in order to do so the power circuit is coupled to a control circuit which reduces reliability and a Zener diode is used to absorb energy which adds to cost and complexity. Further, the circuit functionality changes with temperature which can be undesired.

There is a need for a circuit for DC voltage power supplies which can provide inrush current protection upon startup and during input transients which is simpler to use, lower cost, and able to operate over a wide input voltage range and a wide temperature range than known in the prior art.

SUMMARY OF THE DISCLOSED TECHNOLOGY

A DC voltage power control circuit of embodiments of the disclosed technology has input terminals and output terminals. A semiconductor switch is connected between the input terminal(s) and output terminal(s) and is controlled by a current limiting circuit. The current limiting circuit is operable to limit, in embodiments of the disclosed technology, a low amperage amount of current delivered from the input to output terminals to a predetermined value substantially independent of temperature of the circuit based on a timing circuit which receives current flow after a capacitor is fully charged (defined as "fully charged to a pre-defined capacity which is set to trigger another function in the system"). In other embodiments, the current used can be any current which is able to be handled by a semiconductor device used in the circuitry.

Current limiting mode is defined as the operation mode of the MOSFET, where its gate voltage is very close to its gate threshold voltage, which makes the MOSFET neither fully on, nor fully off, but instead, in a linear mode. In such mode, the current can never exceed a maximum current due to the gate voltage limitation. The gate voltage is the output of the closed feedback loop composed of operational amplifier 208 and the current sense resistor 512

When current reaches a pre-defined threshold, the limiting circuit is activated which causes a PMOS 310 and then a NMOS 318 to be turned on. As such, if the current remains at the threshold, a capacitor 320 is charged from the amplifier 316. Once the capacitor is charged to a pre-determined, preset, or pre-calibrated amount, such a voltage of the capacitor 320 is charged to a level which is enough to flip the outputs of COMP 406 and COMP 416, and then turn on an additional MOSFET 420 operable to disable current to the output terminals.

The current limiting circuit and the short circuit provide a time delay before the current above the predetermined value causes the first semiconductor to be in the off state. A button, activated by physically moving same, or by an electrical connection separate from the rest of the circuit but for the function of the button, in some embodiments of the disclosed technology, causes discharge of the second capacitor and the first semiconductor to return to the non-current limiting state.

Described another way, a protection circuit for limiting the amount of electrical power delivered from a power source to a load has input and output terminals. Therebetween, electrically coupled in a circuit, is a semiconductor switch. A first semiconductor switch is coupled to one of the output terminals and has: a current limiting state, an on state, and an off state. In the current limiting state, activated upon current rising above a pre-designated threshold, a current limiting circuit is turned on which limits current delivery from the input to output terminals. A short circuit protection circuit coupled to the first semiconductor switch, the short circuit protection circuit is coupled to and controls the off state of the first semiconductor switch. The short circuit protection circuit includes a second semiconductor switch outputting current to a capacitor, the short circuit protection circuit turning on and outputting (current) to the capacitor until the capacitor voltage is charged to a pre-designated level at which time current is outputted to a third short circuit protection switch which causes the first semiconductor switch to the off state.

Described yet another way, a protection circuit for limiting the amount of electrical power delivered from a power source to a load has, an NMOS (main switch), and a protection circuit which is engaged upon input current reaches a threshold, the protection circuit having a timing circuit with a capacitor. Upon the capacitor being charged to a predefined value and the latching circuit is activated, the NMOS 510 is turned off. A button connected to the positive input terminal of the comparator 416 can be used to reset the protection circuit. The button can be one which is a mechanical push button or one which is operated by an electric signal (e.g. output of a computing device).

Any device or step to a method described in this disclosure can comprise or consist of that which it is a part of, or the parts which make up the device or step. The term "and/or" is inclusive of the items which it joins linguistically and each item by itself. "Substantially" is defined as "at least 95% of the term being described" and any device or aspect of a device or method described herein can be read as "comprising" or "consisting" thereof.

DETAILED DESCRIPTION OF EMBODIMENTS OF THE DISCLOSED TECHNOLOGY

A negative feedback closed loop circuit composed of an operational amplifier, a main switch, and a current sense resistor is applied to limit the current to a pre-defined threshold whenever there is an overload or short circuit condition is the circuit. A timing circuit composed of resistors and a capacitor is used to provide timing of turning off the circuit. The timing circuit is always charged from the same voltage and started from the same moment of main switching entering into current limit mode. The voltage reference is set by a voltage divider. The timing capacitor voltage and the voltage reference is compared in a comparator. Since both the amplifier circuit and the comparator circuit are temperature independent, the current limiting point and the time delay to turn off the switch are also both independent of temperature. A hysteresis comparator circuit is applied to latch the main switch at off state once it is turned off even if there is no current any more. A push button or an electrical signal can be used to reset the switch once pushed or activated.

Embodiments of the disclosed technology will become more clear in view of the following description of the figures.

Figure 1:
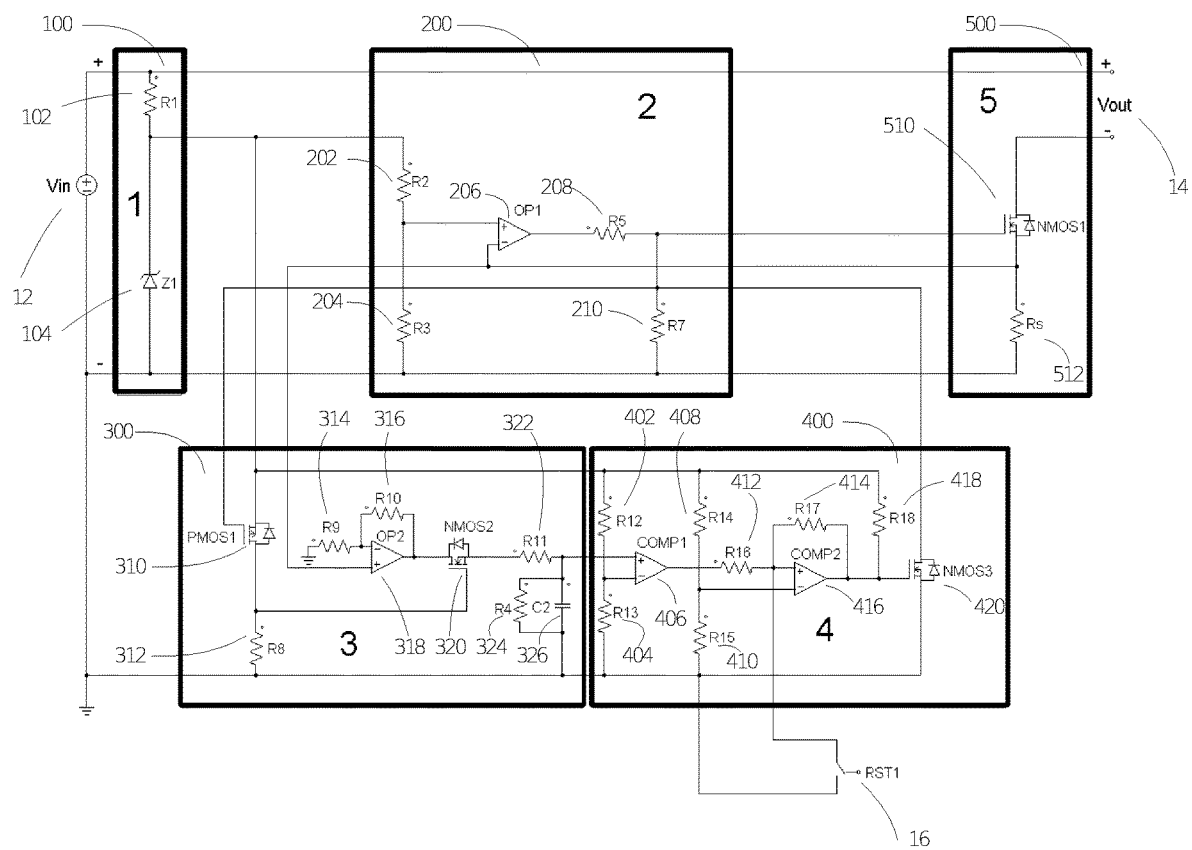
FIG. 1 shows a circuit diagram of a DC power system of an embodiment of the disclosed technology.
Figure 2:
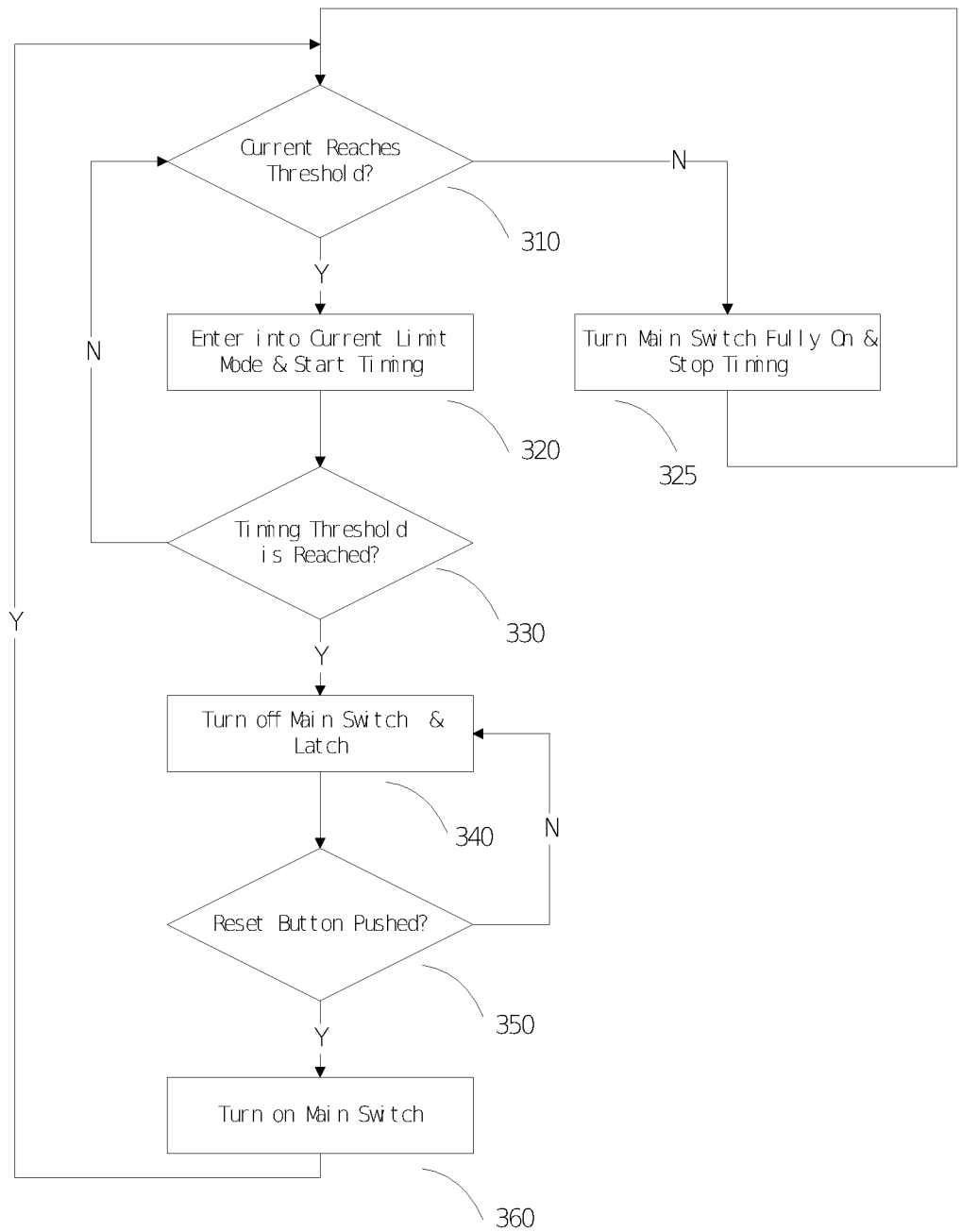
FIG. 2 shows a high level flow chart of a method of the disclosed technology.

FIG. 1 shows a circuit diagram of a DC power system of an embodiment of the disclosed technology. An input direct current voltage 12 is connected to block 1. It should be understood that the specific circuits are shown by way of example and other circuits can be substituted in some embodiments, such as NMOS and PMOS switches described below. Block 1 is an internal control power supply circuit with a Zener diode 104 in series with a resistor 102. A Zener diode is defined as a device which allows current to flow from anode to cathode, but also from cathode to anode when a predefined threshold voltage is surpassed. As the voltage accuracy need on be within about a 10% or 20% tolerance level at low amperage, the series diode 104 and resistor 102 are sufficient to maintain voltage within the tolerance level in this simplified circuit compared to the prior art.

Block 2 divides the voltage along R2 which is resistor 202 and R3 which is resistor 204. This provides a reference voltage to a positive input of OP1, an amplifier 206. OP1 206, resistor 210 (R5), switch 510 (NMOS1), and resistor 512 (Rs) form a negative feedback pathway which lowers the output voltage of the amplifier 206 when the voltage across a resistor 512 (Rs) reaches the reference voltage. The output voltage of the amplifier 208 is passed to the gate of the switch 510 (NMOS1) through the resistor 210. The resistor 210 is used to limit the output current from the amplifier 206 (OP1). When the gate voltage of the switch 510 is lowered, the maximum possible current through the switch 510 has a tendency to drop. This would cause the voltage across the current sense resistor 512 (Rs) to reduce, as a result, the voltage at the negative input terminal of the amplifier 206 might drop, causing the output of the amplifier 206 (OP1) to increase again. The above description is the tendency of the effect of the negative feedback loop. In reality, due to the negative feedback mechanism, the output of the amplifier 206 (OP1) will be just enough to maintain voltage across the current sense resistor 512 (Rs) the same as the positive input terminal voltage, which is set by the voltage divider 202 (R2) and 204 (R3). Therefore, the current limiting point can be calculated as: Ilimit=R3/(R2+R3)*Vz1/Rs.

The Resistor 212 (R7) ensures that when the circuit is powered off, voltage to the gate of NMOS1 remains at zero potential to keep NMOS1 at off state.

Referring now to block 3, this is circuitry implements timing before the circuit is shut off. A PMOS 310 (PMOS1) is a P-channel metal-oxide-semiconductor field effect transistors (MOSFETs) to implement voltage amplifications and switching logic. The PMOS transistor operates by creating an inversion layer in an n-type transistor body. This inversion layer, called the p-channel, can conduct holes between p-type "source" and "drain" terminals. The PMOS 310 is in line with a resistor 310 (R8) to control voltage to the PMOS 310 within a desired range. The current then passes through a resistor 314 (R9) into an amplifier 316 (OP2) which is in parallel with a resistor 315 (R10). The current then flows through a second NMOS 318 (NMOS2) to a resistor 320 (R11). A capacitor 320 (C2) receives current at one node from the NMOS2 and another node from the resistor 312.

When the current through the first NMOS 510 reaches the threshold current, the current will be limited to the threshold current due to the drop of its gate voltage, such as to substantially 5 volts. This causes the PMOS 510 to turn on and, in turn, causes the NMOS2 320 to turn on. The amplifier 318 (OP2) and resistors 314 (R9) and 316 (R10) form an amplifier circuit which takes the voltage across the sense resistor 512 (Rs) as input and amplifies with a ratio equal to the ratio of resistance of resistors 314 (R9) and 316 (R10). The output voltage, or the source terminal voltage of switch 318 (NMOS2) when it is turned on, is Llimit*Rs/R9*(R9+R10)). This is the charging voltage to the timing circuit whenever the timing starts. The timing circuit is composed of resistors 322 (R11), 324 (R4) and capacitor 326 (C2). Since the timing circuit is always charged from the same voltage as stated above, the voltage across the capacitor 326 (C2) can be calculated as Vc=Vz*R9/(R9+R10)*(1−e^(−t/(R4*R11*C2/(R4+R11)))).

Block 4 is the protection and latching circuit. In a first stage, resistors 402 (R12) and 404 (R13) form a voltage divider from the Zener voltage. The voltage across resistor 404 (R13) is fed into the negative input terminal of the comparator 406 (COMP1). The voltage level is R13*Vz/(R12+R13). This voltage sets the reference of the comparator. When the voltage of the capacitor 326 (C2) is charged above this level, the output voltage of the comparator 406 will become high; otherwise it will remain low. The output of the comparator 406 is the input of the second stage, which is a hysteresis comparator, formed by resistors 408 (R14), 410 (R15), 412 (R16), 414 (R17), 418 (R18), and a comparator 416 (COMP2). Resistors 408 (R14) and 410 (R15) form a voltage divider from the Zener voltage. The voltage across the resistor 410 (R15) is fed into the negative input terminal of the comparator 416 (COMP2). The resistors 414 (R16) and 418 (R17) set the hysteresis level of the comparator. It is set in such a way that, during power up, the voltage at the negative input terminal of comparator 416 is higher than the output of the comparator 406 (COMP1). Accordingly, the output of comparator 416 is also low, which keeps the NMOS 420 (NMOS3) at off state; once the output of the comparator 406 (COMP1) becomes high due to a high current in switch 510 (NMOS1), the output of the comparator 416 (COMP2) will become high and turn on NMOS 420 (NMOS3). When NMOS 420 (NMOS3) is turned on, the gate voltage of the switch 510 (NMOS1) becomes zero, so switch 510 is turned off. After switch 510 is turned off, the current becomes zero, so the output of comparator 406 (COMP1) becomes low again. But because of the hysteresis, even though the output of comparator 406 (COMP1) is low, the resistors 414 (R16) and 418 (R17) are designed in such a way that the voltage at the positive input terminal of comparator 416 is still higher than that at the negative input terminal. So even though the current through the main switch 510 is zero, since the output of comparator 416 (COMP2) is still high to keep NMOS 420 (NMOS3) on, the main switch cannot be turned back on again. It is thus latched to the off state. A "latch" is defined as a position in a circuit which is in one of two stable states, such as in a state specified herein. So the function of the circuit block 4 is to turn off and latch the off state whenever the voltage across the capacitor 326 is charged to the reference voltage set by the voltage divider 402 (R12) and 404 (R14). The time delay from the moment the current limiting happens to the moment the main switch is turned off can be calculated as the time required to charge the voltage of capacitor 326 to the output voltage of the voltage divider of 402 (R12) and 404 (R13). In mathematical form, it is:

$$T\text{delay}=(R4*R11*C2/(R4+R11))*\ln(R9*(R12+R13)/(R9*R13-R10*R12))$$

Once the circuit is design, all the above resistances and capacitances are constant values, so it means that after a short circuit happens, the switch will be turned off after a fixed period of time. All the resistors and capacitors can be chosen to have very low temperature coefficient, so that the time delay is almost not varying with temperature. This is a very important feature to protect the circuit; otherwise, the internal parts, especially the main switch 510 might be over stress when temperature goes up.

In order to reset the switch after the failure is cleared, a push button can be connected in parallel with the positive input terminal of comparator 416. Once pushed, it forced the voltage at the positive terminal of comparator 416 to be lower than that of the negative input terminal, to turn NMOS 420 off, and then in turn, to turn the main switch 510 (NMOS1) back on again. An electronic signal can be connected in the same manner to reset the circuit as well.

FIG. 3 shows a high level flow chart of a method of the disclosed technology. As judged in Box 310, if the circuit current is less than a threshold, the main switch is in fully on state and the time circuit is deactivated, as shown in Box 325; if the circuit current reaches the threshold, the main switch is forced into the current limit mode, and a timing circuit starts to activate, as indicated in Box 320. The timing circuit keeps charging a capacitor and compared it with a threshold voltage, as shown in Box 330. If the voltage threshold is not reached, it goes back to check the circuit current in Box 310; if the voltage threshold is reached, the main switch will be turned off and be latched to the off state, as shown in Box 340. In the latched condition, it is possible to reset the switch through a push button, as shown in Box 350. If the button is not pushed, the switch will stay at the latched off state as in Box 340; If the button is pushed, then the main switch will be turned back on as shown in Box 360, and then go back to check the circuit current again in Box 310.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods, systems, and devices described herein-above are also contemplated and within the scope of the disclosed technology.

I claim:

1. A direct current voltage power control circuit comprising:
   input terminals;
   output terminals;
   a semi-conductor switch electrically connected between said input terminals and said output terminals;
   a current limiting circuit controlling said semiconductor switch, said current limiting circuit operable to limit current delivered from said input terminals to said output terminals at a maximum predetermined value; and
   a timing circuit receiving current flow after output current is at or above a pre-defined threshold causing a capacitor in said timing circuit to be charged to a pre-defined voltage;
   wherein said current limiting circuit is operated to deliver said maximum predetermined value of current to said output terminals by a MOSFET when said MOSFET is substantially or fully at a gate voltage threshold thereof; and
   wherein during a time when said input current remains at or above said pre-determined threshold, said capacitor is charged from an amplifier.

2. The circuit of claim 1, where said current limiting circuit operates substantially independent of a temperature of said circuit.

3. The circuit of claim 1, wherein upon activation of said current limiting circuit, a second and third semi-conductor switch are turned on.

4. The circuit of claim 1, wherein said capacitor is charged to a pre-determined threshold and causes at least one comparator to turn off said first semi-conductor switch.

5. The circuit of claim 4, wherein said turn off of said first semi-conductor switch disables current to said output terminals.

6. The circuit of claim 1, wherein said current limiting circuit provides a time delay before said input current above said pre-defined threshold causes said semi-conductor switch to be in an off state.

7. The circuit of claim 1, wherein a voltage to said timing circuit is constant while said capacitor in said timing circuit is being charged.

8. The circuit of claim 1, wherein said receiving of current to said timing circuit is after a semi-conductor switch is turned on based on increased current flow thereto.

9. A direct current voltage power control circuit comprising:
   input terminals;
   output terminals;
   a semi-conductor switch electrically connected between said input terminals and said output terminals;
   a current limiting circuit controlling said semiconductor switch, said current limiting circuit operable to limit current delivered from said input terminals to said output terminals at a maximum predetermined value; and
   a timing circuit receiving current flow after output current is at or above a pre-defined threshold causing a capacitor in said timing circuit to be charged to a pre-defined voltage;

wherein said current limiting circuit is operated to deliver said maximum predetermined value of current to said output terminals by a MOSFET when said MOSFET is substantially or fully at a gate voltage threshold thereof; and wherein a second comparator in said circuit causes said semi-conductor to be latched in an off state until reset.

10. The circuit of claim 9, further comprising a button which is electrically connected to said second comparator causes a cessation of a limitation of current from said input terminals to said output terminals.

11. The circuit of claim 10, wherein said button is activated by being physically pressed or moved.

12. The circuit of claim 10, wherein said button is activated by way of an electrical connection separate from electrical connections of said circuit.

13. A direct current voltage power control circuit comprising:
 input terminals;
 output terminals;
 a semi-conductor switch electrically connected between said input terminals and said output terminals;
 a current limiting circuit controlling said semiconductor switch, said current limiting circuit operable to limit current delivered from said input terminals to said output terminals at a maximum predetermined value; and
 a timing circuit receiving current flow after output current is at or above a pre-defined threshold causing a capacitor in said timing circuit to be charged to a pre-defined voltage;
 wherein said current limiting circuit is operated to deliver said maximum predetermined value of current to said output terminals by a MOSFET when said MOSFET is substantially or fully at a gate voltage threshold thereof; and
 wherein said gate voltage threshold based on a feedback loop comprising an amplifier and a current sense resistor in said circuit.

14. The circuit of claim 13, wherein said feedback loop further comprises said semi-conductor switch and a resistor electrically coupled to said semi-conductor switch.

* * * * *